(12) United States Patent
Hsu et al.

(10) Patent No.: US 11,925,035 B2
(45) Date of Patent: Mar. 5, 2024

(54) SYSTEM ARCHITECTURE, STRUCTURE AND METHOD FOR HYBRID RANDOM ACCESS MEMORY IN A SYSTEM-ON-CHIP

(71) Applicant: UNITED MICROELECTRONICS CORP., Hsin-Chu (TW)

(72) Inventors: Po-Kai Hsu, Tainan (TW); Hui-Lin Wang, Taipei (TW); Ching-Hua Hsu, Kaohsiung (TW); Yi-Yu Lin, Taichung (TW); Ju-Chun Fan, Tainan (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/973,557

(22) Filed: Oct. 26, 2022

(65) Prior Publication Data

US 2023/0050435 A1 Feb. 16, 2023

Related U.S. Application Data

(62) Division of application No. 17/033,901, filed on Sep. 27, 2020, now Pat. No. 11,522,013.

(30) Foreign Application Priority Data

Aug. 24, 2020 (CN) .......................... 202010855208.7

(51) Int. Cl.
*H10B 61/00* (2023.01)
*H10B 63/00* (2023.01)
*H10N 50/01* (2023.01)
*H10N 50/10* (2023.01)
*H10N 50/80* (2023.01)
*H10N 70/00* (2023.01)
*H10N 70/20* (2023.01)

(52) U.S. Cl.
CPC ............. *H10B 63/80* (2023.02); *H10B 61/00* (2023.02); *H10N 50/01* (2023.02); *H10N 50/10* (2023.02); *H10N 50/80* (2023.02); *H10N 70/063* (2023.02); *H10N 70/24* (2023.02); *H10N 70/826* (2023.02); *H10N 70/8833* (2023.02)

(58) Field of Classification Search
CPC ..... G06F 12/0238; H10B 63/80; H10B 61/00; H10N 50/01; H10N 50/10; H10N 50/80; H10N 70/063; H10N 70/24; H10N 70/826; H10N 70/8833
See application file for complete search history.

(56) References Cited

U.S. PATENT DOCUMENTS

| 7,023,726 | B1 | 4/2006 | Chen |
| 7,723,128 | B2 | 5/2010 | Wang |
| 9,472,257 | B2 | 10/2016 | Dong |
| 10,170,185 | B2 | 1/2019 | Manipatruni |
| 2009/0283736 | A1 | 11/2009 | Kanzawa |
| 2012/0239856 | A1 | 9/2012 | Cho |

(Continued)

*Primary Examiner* — Shih Tsun A Chou
(74) *Attorney, Agent, or Firm* — Winston Hsu

(57) ABSTRACT

A hybrid random access memory for a system-on-chip (SOC), including a semiconductor substrate with a MRAM region and a ReRAM region, a first dielectric layer on the semiconductor substrate, multiple ReRAM cells in the first dielectric layer on the ReRAM region, a second dielectric layer above the first dielectric layer, and multiple MRAM cells in the second dielectric layer on the MRAM region.

6 Claims, 11 Drawing Sheets

(56) References Cited

U.S. PATENT DOCUMENTS

| | | |
|---|---|---|
| 2013/0121060 A1 | 5/2013 | Lee |
| 2015/0171316 A1 | 6/2015 | Park |
| 2018/0211910 A1 | 7/2018 | Lee |
| 2019/0066763 A1* | 2/2019 | Apodaca .............. H10N 70/231 |
| 2019/0165258 A1 | 5/2019 | Peng |
| 2020/0161236 A1 | 5/2020 | Kim |
| 2021/0278998 A1* | 9/2021 | Li ....................... G06F 12/0246 |
| 2021/0305495 A1 | 9/2021 | Shen |

* cited by examiner

SYSTEM ARCHITECTURE, STRUCTURE AND METHOD FOR HYBRID RANDOM ACCESS MEMORY IN A SYSTEM-ON-CHIP

CROSS REFERENCE TO RELATED APPLICATIONS

This application is a division of U.S. application Ser. No. 17/033,901, filed on Sep. 27, 2020. The content of the application is incorporated herein by reference.

BACKGROUND OF THE INVENTION

1. Field of the Invention

The present invention relates generally to a system architecture for hybrid random access memory, and more specifically, to a system architecture for hybrid random access memory with magnetoresistive random access memory (MRAM) and resistive random access memory (ReRAM) in a system-on-chip.

2. Description of the Prior Art

After years of research and development, there are several emerging memories rising the in electronic industry, such as 3D XPoint, magnetoresistive random access memory (MRAM), phase change memory (PCM), resistive random access memory (ReRAM) and ferroelectric random access memory (FeRAM). Some of these emerging memories are even expected to replace dynamic random access memory (DRAM), NOR flash, NAND flash and static random access memory (SRAM) widely used in current electronic products, and start to be used in standalone chip and application specific integrated circuit (ASIC), microcontroller or even processor, to make them more competitive than conventional memory technologies.

With respect to current microcontroller architecture and AI application, the memory required should meet the needs of high performance and non-volatility, thus the emerging memories with these characteristics are good options. However, the application of these emerging memories is only at system level. Hybrid emerging memories integrated and manufactured in a system-on-chip (SOC) is still not achievable. Therefore, those persons skilled in the art still need to further research and improve current hybrid random access memory architecture.

SUMMARY OF THE INVENTION

In light of the fact that memory system architecture nowadays and relevant process still can't integrate and achieve hybrid memory operation in a system-on-chip (SOC), the present invention hereby provides a system architecture, structure and manufacturing method for hybrid random access memory integrated with magnetoresistive random access memory (MRAM) and resistive random-access memory (ReRAM) in a system-on-chip. This system architecture with hybrid random access memory is suitable for high-performance microcontroller and AI application, and can meet the needs of high-speed/low-speed access and digital/analog circuit.

One aspect of the present invention is to provide a system architecture for hybrid random access memory in a system-on-chip, including a computing unit, a hybrid register coupled to the computing unit, multiple magnetoresistive random access memory (MRAM) blocks, wherein each of the MRAM blocks comprises multiple MRAM cells coupled to a MRAM controller, and the MRAM controller is coupled to the hybrid register, and multiple resistive random-access memory (ReRAM) blocks, wherein each of the ReRAM blocks comprises multiple ReRAM cells coupled to a ReRAM controller, and the ReRAM controller is coupled to the hybrid register, wherein the ReRAM cells and the MRAM cells are on the same semiconductor substrate.

Another aspect of the present invention is to provide a hybrid random access memory in a system-on-chip, including a semiconductor substrate with a MRAM region and a ReRAM region, a first dielectric layer on the semiconductor substrate, multiple ReRAM cells in the first dielectric layer on the ReRAM region, a second dielectric layer above the first dielectric layer, and multiple MRAM cells in the second dielectric layer on the MRAM region.

Still another aspect of the present invention is to provide a method of manufacturing a hybrid random access memory in a system-on-chip, including steps of providing a semiconductor substrate with a MRAM region and a ReRAM region, forming multiple ReRAM cells in the ReRAM region on the semiconductor substrate, forming a first dielectric layer on the semiconductor substrate, wherein the ReRAM cells are in the first dielectric layer, forming multiple MRAM cells in the MRAM region on the first dielectric layer, and forming a second dielectric layer on the first dielectric layer, wherein the MRAM cells are in the second dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
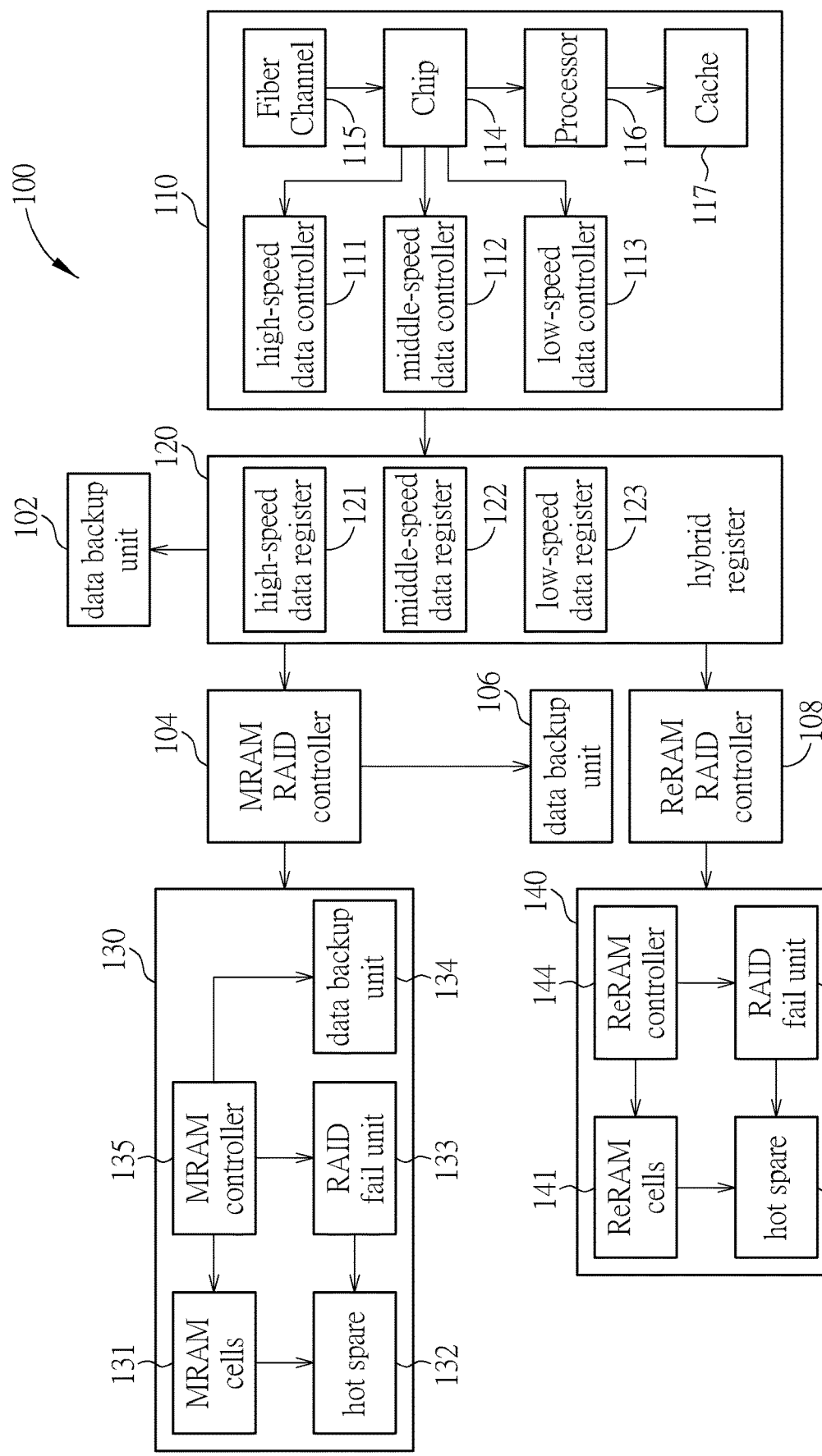
FIG. 1 is a system architecture diagram of a hybrid random access memory in accordance with the embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

As used herein, the term "substrate" refers to a material onto which subsequent material layers are added. The substrate itself can be patterned. Materials added on top of the substrate can be patterned or can remain non-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

Furthermore, as used herein, RAID is an abbreviation of redundant array of independent disks. In general, RAID technology is a method of storing data on multiple disks or memories. By storing data on different disks or memories, I/O operation may be overlapped in a balancing fashion to improve system performance. Since multiple disks or memories may increase mean time between failures (MTBF), storing data in RAID may improve failure tolerance.

The present invention provides a system architecture for hybrid random access memory with different magnetoresistive random access memory (MRAM) and resistive random-access memory (ReRAM). More particularly, the different MRAM and ReRAM are made in the same process and on the same wafer or substrate, with the benefit of process integration and applicability in system-on-chip (SOC) design.

Please refer now to FIG. 1, which is a system architecture diagram of hybrid random access memory in accordance with the embodiment of present invention. It should be noted that this architecture implements data storage including two different memories, i.e. MRAM and ReRAM. Generally, MRAM is a non-volatile memory whose data is stored by magnetic storage devices rather than been stored in electric charge or current form. ReRAM is also a kind of non-volatile memory, with an operating principle that resistance of transition metal oxides in the memory cell would change along with the bias applied thereon to represent the stored values of a bit.

As shown in figure, the system architecture 100 may be applied in microcontroller (MCU) or in system-on-chip (SOC). A hybrid register 120 is included inside and is coupled to a computing unit 110. A data backup unit 102, a MRAM RAID controller/decoder 104 and a ReRAM RAID controller/decoder 108 are coupled to the hybrid register 120. A data backup unit 106 and a MRAM block 130 are coupled to the MRAM RAID controller 104. MRAM RAID controller 104 and ReRAM RAID controller may manage the data access respectively in MRAM block 130 and ReRAM block 140 in physical model and logical model.

As shown in the figure, each MRAM block 130 includes multiple MRAM cells 131, a hot spare 132 coupled to the MRAM cells 131, a MRAM controller 135 coupled to the MRAM cells 131, a RAID fail unit 133 coupled to a MRAM controller 135 and a data backup unit 134 coupled to the MRAM controller 135. MRAM cell 131 is the minimal unit in memory storage, and MRAM controller 135 controls the connection and operation of various functional blocks in MRAM block 130.

Furthermore, a ReRAM block 140 is coupled a ReRAM RAID controller 108. The ReRAM block 140 includes multiple ReRAM cells 141, a hot spare 142 coupled to the ReRAM cells 141, a ReRAM controller 144 coupled to the ReRAM cells 141 and a RAID fail unit 143 coupled to the ReRAM controller 144 and the hot spare 142. ReRAM cell 141 is the minimal unit in memory storage, and ReRAM controller 144 controls the connection and operation of various functional blocks in ReRAM block 140.

In the embodiment of present invention, hybrid register 120 includes a high-speed data register 121, a middle-speed data register 122 and a low-speed data register 123. A data backup unit 102 is coupled to the hybrid register 120. The hybrid register 120 may be used to temporally store instructions, data and addresses and to accelerate the execution of computer programs through rapid data access. In particular, to fit various memory architectures, three different registers 121, 122 and 123 with high-speed/middle-speed/low-speed are used to temporally store the data from memories with different read/write speeds. For example, the three different speeds corresponds respectively to the cache 117 in computing unit 110, the MRAM block 130 and the ReRAM block 140.

The computing unit 110 generally includes a chip 114, for example a chip to integrate system and peripheral components. A high-speed data controller 111, a middle-speed data controller 112 and a low-speed data controller 113 are coupled to the chip 114 to receive data with different speeds from the hybrid register 120 or transfer corresponding data thereto. A fiber channel 115 is coupled to the chip 114 to provide high-speed internet connection. A processor 116, such as a command and data processor, is coupled to the chip 114. The cache 117, such as a static random access memory (SRAM), is coupled to the processor 116.

Figure 2:
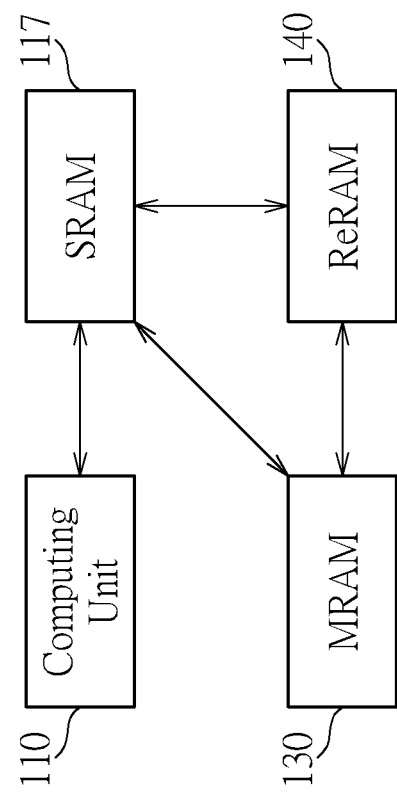
FIG. 2 is a fundamental system architecture diagram of a hybrid random access memory in accordance with the embodiment of present invention.

Please refer to FIG. 2. In real implementation, the MRAM block 130 in the embodiment may be used to replace conventional dynamic random access memory (DRAM) to act as a data buffer for the system, with the benefit of higher read/write speeds, non-volatility, high memory capacity and density. The ReRAM block 140 may be used to replace conventional flash memory or solid state disks (SSD), which has lower read/write speeds, and act as a data storage device. The MRAM block 130 and the ReRAM block 140 may be coupled to each other and be coupled to the cache 117, ex. SRAM, in the computing unit 110 through aforementioned common hybrid register 120. The computing unit 110 may process the data stored or buffered in the three different memories.

After describing the system architecture of hybrid random access memory of the present invention, FIGS. 3-14 will be referred in next embodiment to describe the process flow of manufacturing two different memories, i.e. MRAM and ReRAM, on the same substrate or wafer. Please notes that, since the components and features in regular front-end-of-line (FEOL) process is not the focus of the present invention, the description and illustration of the components in FEOL process, including gates, sources/drains, active areas or/and doped areas etc., will be omitted in the embodiment and cross-sections. As a whole, the description of memory process will begin from interlayer dielectrics and contacts in the middle-end-of-line (MEOL) process.

Figure 3:
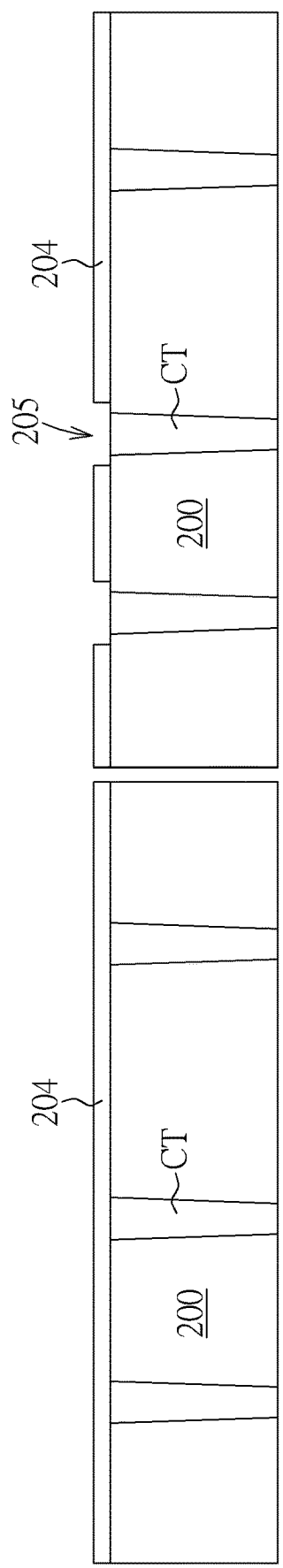
FIGS. 3-14 are cross-sections of a process flow of manufacturing two different memories, i.e. MRAM and ReRAM, on the same wafer.

Please refer to FIG. 3. First, provide a substrate, such as a silicon substrate, with an interlayer dielectrics (ILD) 200 formed thereon. In the embodiment of present invention, a first region 201 and a second region 202 are demarcated on the substrate, wherein the first region 201 is intended to form MRAM memory and the second region 202 is intended to form ReRAM memory. Other regions with different purposes, such as logic region and peripheral region, may also be demarcated on the substrate, but they will not be shown in the figures.

In the embodiment of present invention, interlayer dielectrics 200 may be a single layer structure or multilayer structure formed through CVD process with materials such as tetraethoxysilane (TEOS). Contacts CT are formed in the interlayer dielectrics 200 and are electrically connected to gates, sources/drains and active areas (not shown) below formed in FEOL process. The material of contact CT may be Cu, Al W, etc., and a barrier layer (not shown) may be formed between contacts CT and interlayer dielectrics 200. A thin dielectric capping layer 204 is formed on entire surface of the interlayer dielectrics 200. Contacts CT are also covered by the dielectric capping layer 204. The interlayer dielectrics 200 may act as a diffusion barrier and an etch stop layer, with materials such as silicon carbonitride (SiCN). In the embodiment, openings 205 will be formed in the dielectric capping layer 204 on the second region 202 to expose contacts CT below through photolithography. Opening will not be formed in the dielectric capping layer 204 on the first region 202 in this step.

Figure 4:
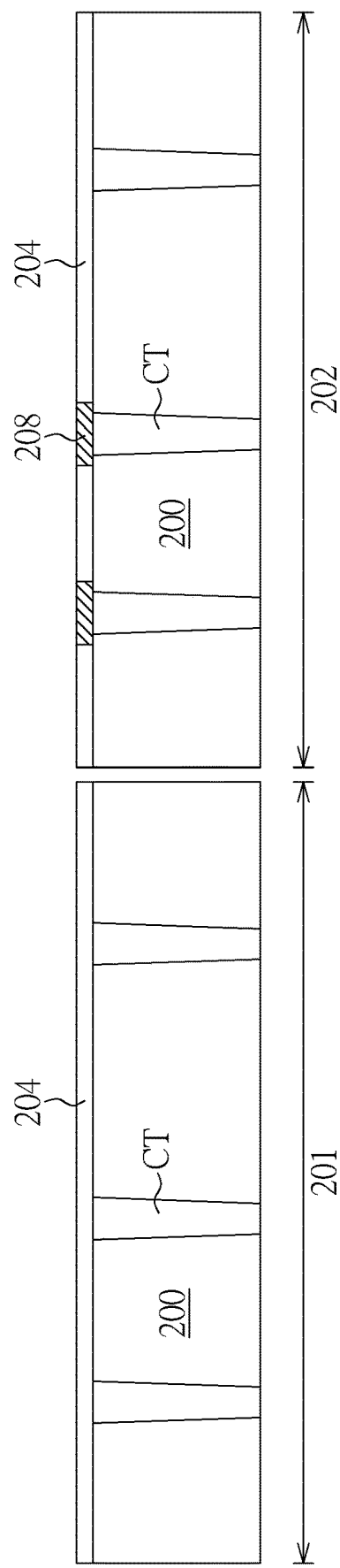

Please refer to FIG. 4. After openings 205 are formed, the bottom electrode 208 of ReRAM cell is formed in the opening 205 to electrically connect the contact CT below. The material of bottom electrode 208 may be tantalum nitride (TaN). The steps of forming bottom electrode 208 may include: performing a CVD process to form a conformal bottom electrode material layer on the surface of dielectric capping layer 204, performing a CMP process with dielectric capping layer 204 as a stop layer to remove the portion on the dielectric capping layer 204, so that the top surfaces of bottom electrode 208 and dielectric capping layer 204 are flush.

Figure 5:
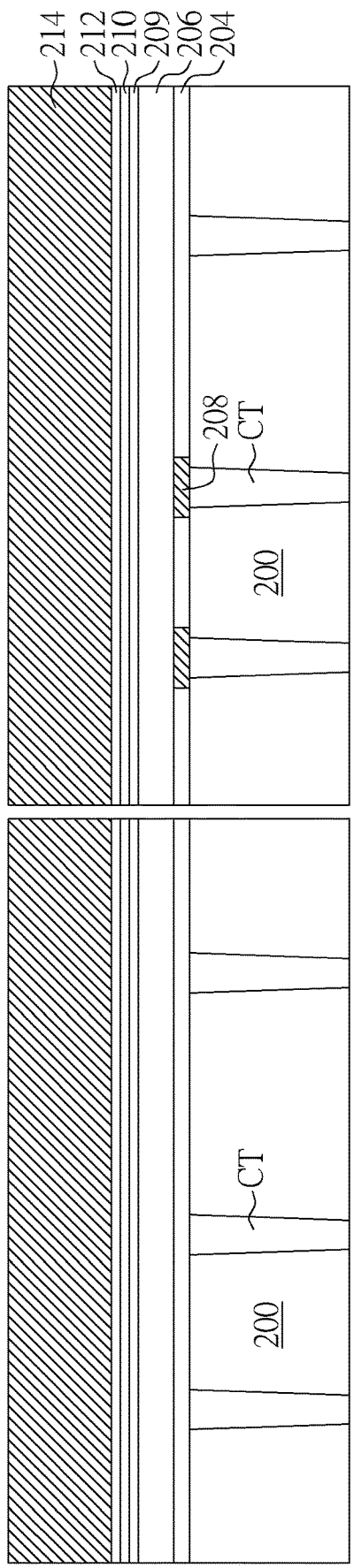

Please refer to FIG. 5. After bottom electrodes 208 are formed, a tantalum oxide (TaO$_x$) layer 206, a tantalum pentaoxide (Ta$_2$O$_5$) layer 209, an iridium layer 210, a ruthenium layer 212 and a titanium nitride layer 214 are sequentially formed on the dielectric capping layer 204. In these layers, tantalum oxide layer 206, tantalum pentaoxide layer 209 and iridium layer 210 may serve collectively as a variable resistive portion of the ReRAM cell and may be formed through CVD or PVD process. The ruthenium layer 212 and titanium nitride layer 214 may serve collectively as a top electrode of the ReRAM cell and may be formed through PVD process, wherein the ruthenium layer 212 may also serve as an etch stop layer in the process.

Figure 6:
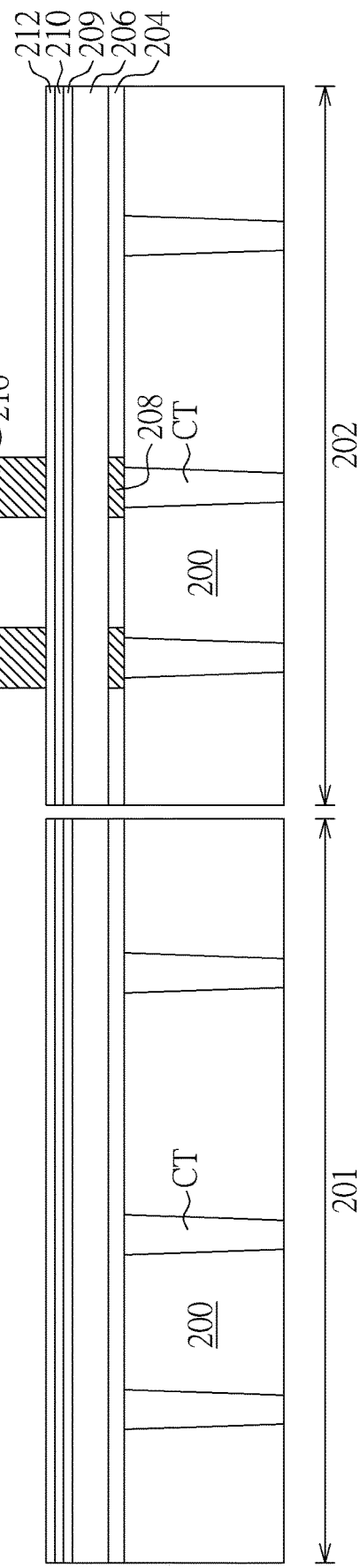

Please refer to FIG. 6. After the tantalum oxide layer 206, the tantalum pentaoxide layer 209, the iridium layer 210, the ruthenium layer 212 and the titanium nitride layer 214 are formed, a photolithography process is performed using the ruthenium layer 212 as an etch stop layer to pattern the titanium nitride layer 214, thereby forming the pattern of top electrode 216 of the ReRAM cell. In this step, the titanium nitride layer 214 on the first region 201 and the second region 202 are completely removed except the portion of patterned top electrode 216 on the second region 202.

Figure 7:
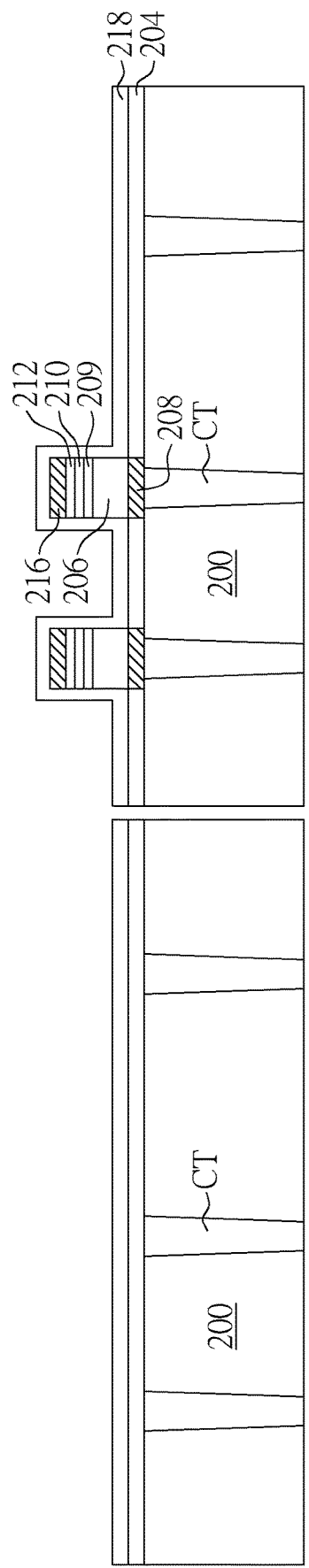

Please refer to FIG. 7. After top electrodes 216 are formed, a reactive-ion etching process is performed using top electrodes 216 as a hard mask and dielectric capping layer 204 as an etch stop layer to remove the tantalum oxide layer 206, the tantalum pentaoxide layer 209, the iridium layer 210 and the ruthenium layer 212 except the portion under the top electrodes 216, thereby forming ReRAM cells with layer structures such as the bottom electrode 208, a variable resistive layer (including tantalum oxide layer 206 and the tantalum pentaoxide layer 209), the iridium layer 210 and the ruthenium layer 212. Afterwards, a conformal, protective capping layer 218 is formed on entire surface of the substrate. The capping layer 218 may be formed by CVD process using materials such as silicon nitride.

Figure 8:
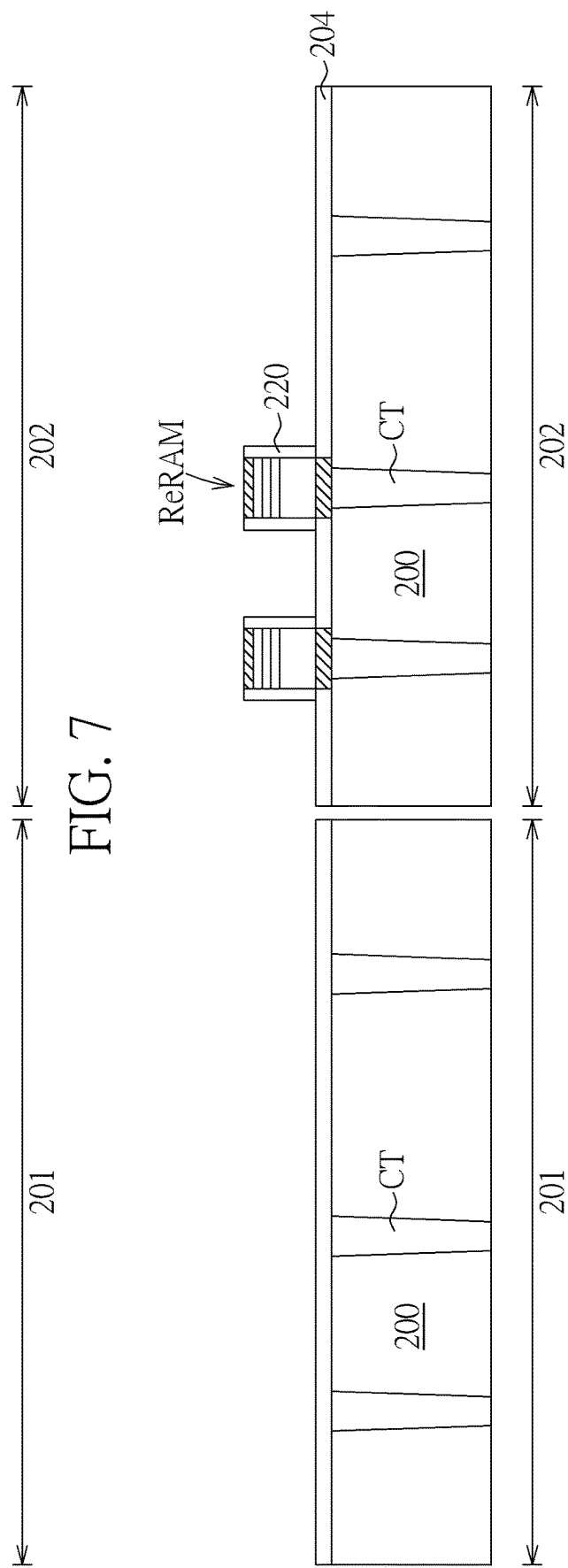

Please refer to FIG. 8. After the capping layer 218 are formed, an anisotropic etching process is performed to remove the capping layer 218 on the surfaces of ReRAM cells and dielectric capping layer 204, so that the capping layer 218 only remains on sidewalls of the ReRAM cells and spacers 220 of the ReRAM cells are formed.

Figure 9:
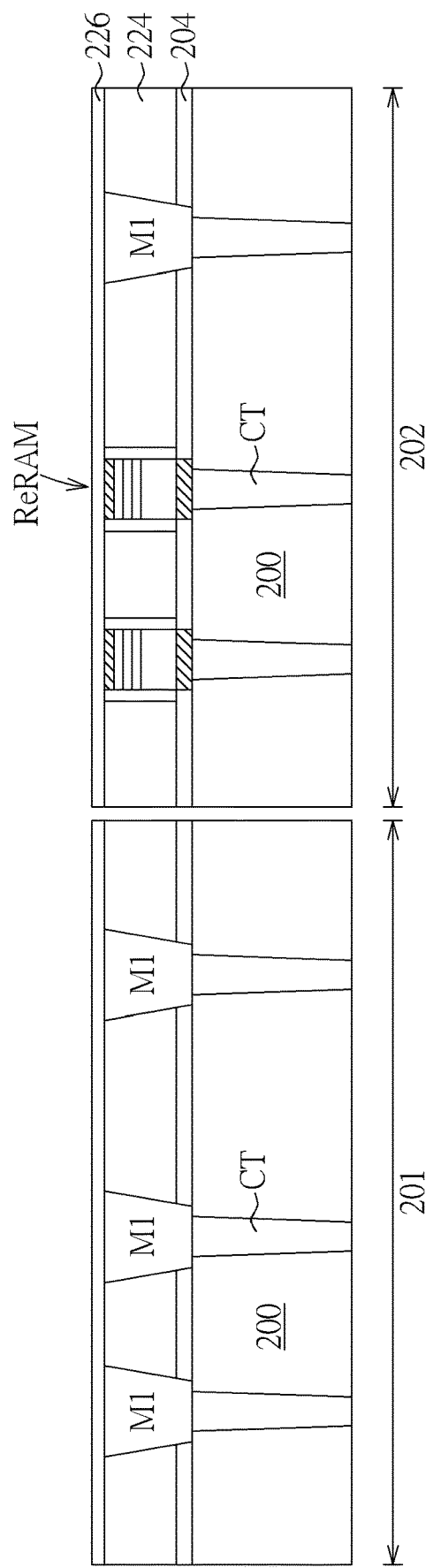

Please refer to FIG. 9. After spacers 220 are formed, an inter-metal dielectrics (IMD) 224 is formed surrounding the ReRAM cells. The material of inter-metal dielectrics 224 may be ultra low-k material such as silicon oxycarbide (SiOC). The steps of forming inter-metal dielectrics 224 may include: performing a CVD process to deposit an ultra low-k material layer on the surface of substrate, performing a CMP process with top electrodes 216 of the ReRAM cells as a stop layer to remove the portion above the top electrodes 216, so that the top surface of inter-metal dielectrics is flush with the top surface of top electrode 216 of the ReRAM cell.

Refer still to FIG. 9. After the inter-metal dielectrics 224 is formed, metal interconnects, such as first metal layer M1, may be formed in the inter-metal dielectrics 224 to electrically connect to the contacts CT below. The first metal layer M1 may be formed by single damascene process using materials such as Cu, Co or Ru. Please note that in the embodiment of present invention, unlike ReRAM cells are formed only on the second region 202 of the substrate, the first metal layer M1 may be formed on the first region 201 and the second region 202 of the substrate. Lastly, another thin dielectric capping layer 226 is formed on entire surface of the substrate to cover ReRAM cells and the first metal layer M1. Similarly, the material of interlayer dielectrics 226 may be SiCN to serve as a diffusion barrier and an etch stop layer.

Figure 10:
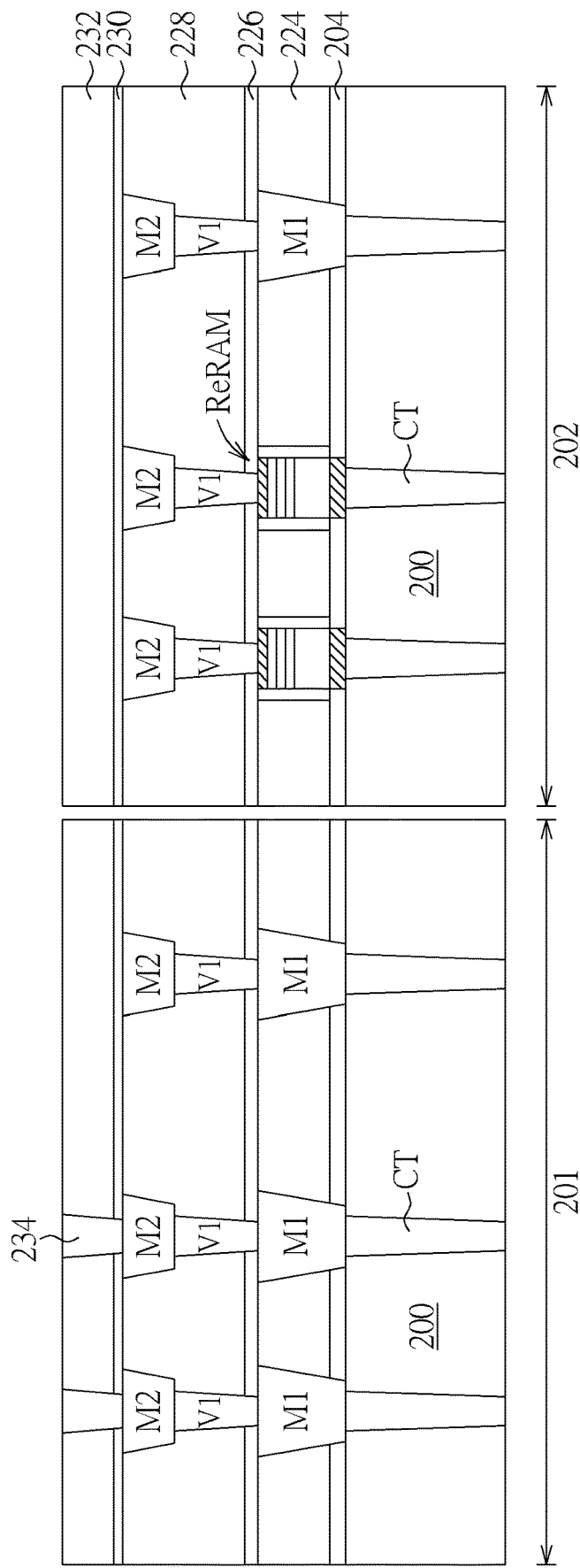

Please refer to FIG. 10. After the dielectric capping layer 226 is formed, another inter-metal dielectrics 228 is formed on the dielectric capping layer 226, and metal interconnects, such as vias V1 and a second metal layer M2, are formed in the inter-metal dielectrics 228, wherein vias V1 are electrically connected to the first metal layer M1 or the top electrodes 216 of ReRAM cells below. The inter-metal dielectrics 228 may be formed by CVD and CMP processes with a material such as ultra low-k dielectrics. Vias V1 and the second metal layer M2 may be formed by dual damascene process, which may include steps of etching the inter-metal dielectrics 228 with dielectric capping layer 226 as an stop layer to form holes for the vias V1 and trenches for the second metal layer M2, then metal material such as Cu or Co is filled in the holes and trenches to form the metal interconnects. Lastly, another SiCN-based dielectric capping layer 230 is formed on entire surface of the substrate to cover the second metal layer M2 and the inter-metal dielectrics 228.

After the manufacture of ReRAM cells (including the electrically connected interconnects such as vias V1 and second metal layer M2 above) are completed, RMAM cells will be manufactured on the level above the ReRAM cells. This embodiment will illustrate the example of MRAM cells manufactured on a level next to the inter-metal dielectrics 228 (including vias V2 and a third metal layer M3). Please note that the MRAM cells in the present invention may also be manufactured in other inter-metal dielectrics level than the current one, and the MRAM cells will only be formed on the first region 201, exclusive of the second region 202, so that they will not overlap the ReRAM cells on the second region 202.

Refer still to FIG. 10. Firstly forming a dielectric layer 232 on the dielectric capping layer 230. The dielectric layer 232 may be formed by CVD process with a material such as TEOS, then vias 234 are formed in the dielectric layer 232 on the first region 201. The material of vias 234 is but not limited to W, Cu, Al, TiAl, CoWP or the group thereof. Vias 234 are electrically connected to the below interconnects, such as a second metal layer M2.

Figure 11:
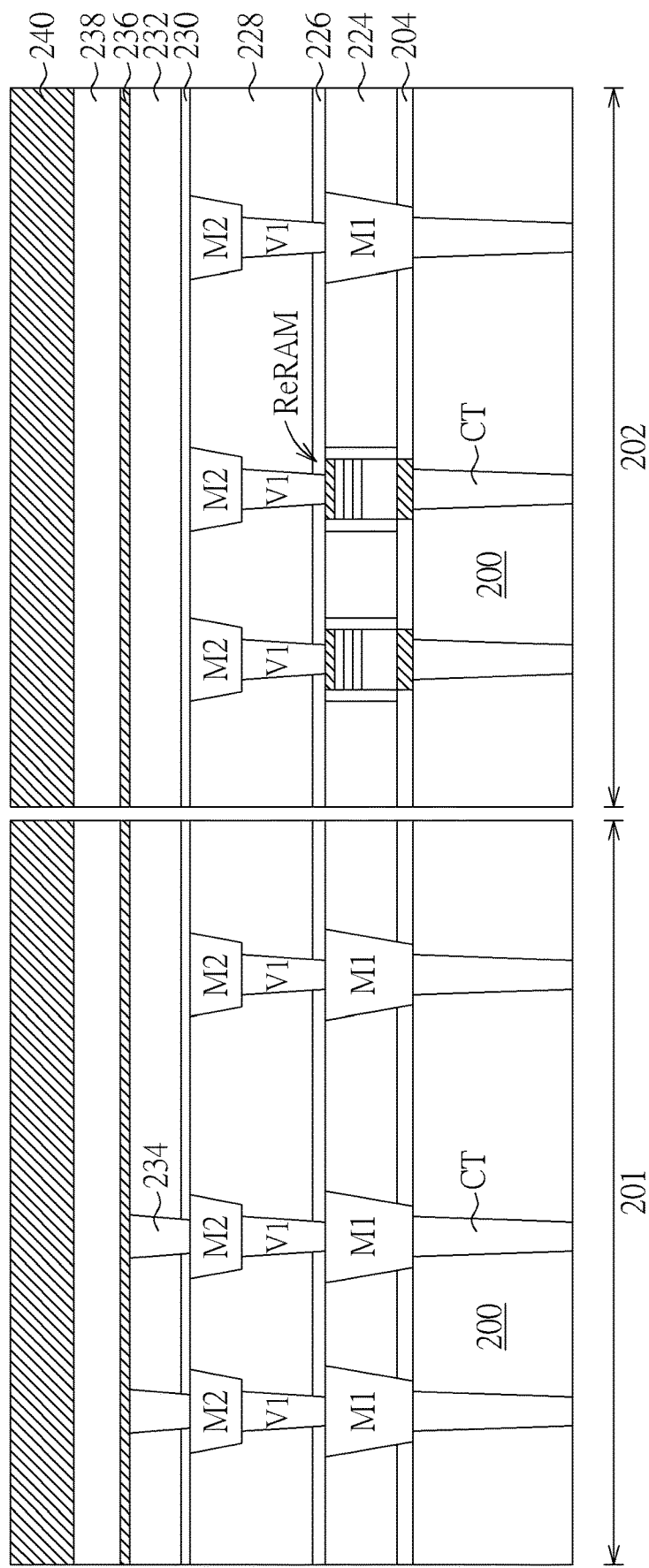

Please refer to FIG. 11. After vias 234 are formed, a bottom electrode layer 236, a magnetic tunnel junction (MTJ) layer 238 and a top electrode layer 240 are formed sequentially on the dielectric layer 232. The bottom electrode layer 236, the magnetic tunnel junction layer 238 and the top electrode layer 240 may be in-situ formed in the same chamber by PVD process. In the embodiment of present invention, the material of bottom electrode layer 236 is preferably conductive material such as TaN, but is not limited thereto. In other embodiment of present invention, the bottom electrode layer 236 may include materials such as Ta, Pt, Cu, Au, Al or the combination thereof. The magnetic tunnel junction layer 238 is a multilayer structure, which may include a seed layer, a pinned layer, a reference layer, a tunnel barrier layer, a free layer and a metal spacer.

In general, the pinned layer may be made of antiferromagnetic (AFM) materials, such as FeMn, PtMn, IrMn, NiO, etc., to fix or confine the direction of magnetic moment of adjacent layers. The tunnel barrier layer may be made of insulating oxide such as $AlO_x$ or MgO, but not limited thereto. The free layer is made of ferromagnetic materials, such as Fe, Co, Ni or the alloys thereof (ex. CoFeB), but not limited thereto. The direction of magnetization of the free layer will be freely changed by external magnetic field. Since the structure of magnetic tunnel junction layer 238 is not the focus of present invention, a magnetic tunnel junction layer 238 is used in the figure to represent all of the above layer structures. The material of top electrode layer 240 is preferably TiN.

Figure 12:
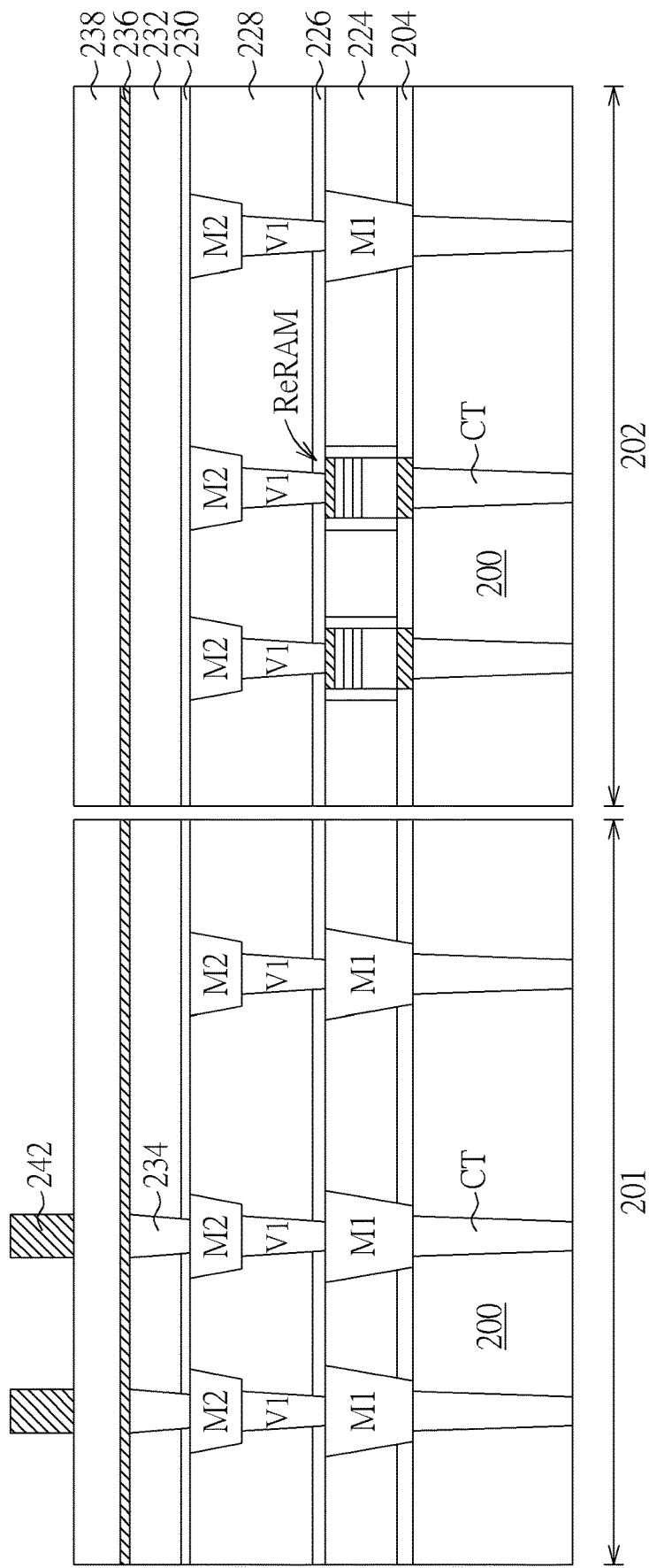

Please refer to FIG. 12. After the bottom electrode layer 236, the magnetic tunnel junction layer 238 and the top electrode layer 240 are formed, a photolithography process is performed to pattern the top electrode layer 240, thereby forming the pattern of top electrodes 242 of the MRAM cells. In this step, the top electrode layer 240 on the first region 201 and the second region 202 are completely removed except the portion of patterned top electrode 242 on the first region 201.

Figure 13:
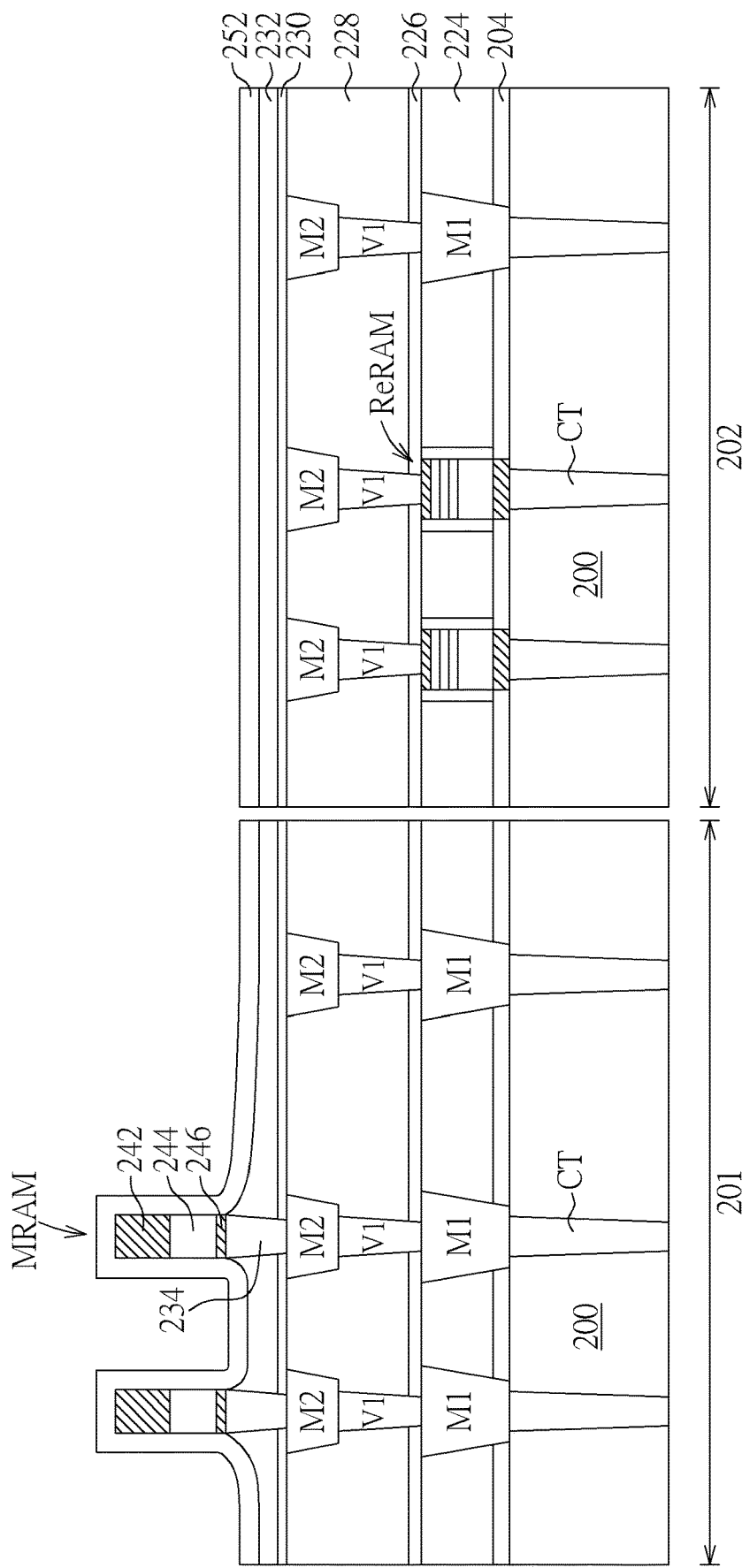

Please refer to FIG. 13. After the top electrodes 242 are formed, a reactive-ion etching process is performed using the top electrodes 242 as a hard mask to remove the magnetic tunnel junction layer 238 and the bottom electrode layer 236 except the portion under the top electrodes 242, thereby forming MRAM cells with bottom electrodes 246, magnetic tunnel junction layers 244 and top electrodes 242. Since the characteristics of ion beam etching process, the upper surface of remaining dielectric layer 232 would be a concave surface slightly lower than the top surface of vias 234. Afterwards, a conformal, protective capping layer 252 is formed on entire surface of the substrate. The capping layer 252 may be formed by CVD process using materials such as silicon nitride. The material of the capping layer 252 may also include silicon oxide, silicon oxynitride or silicon carbonitride, depending on the requirement of the process.

Figure 14:
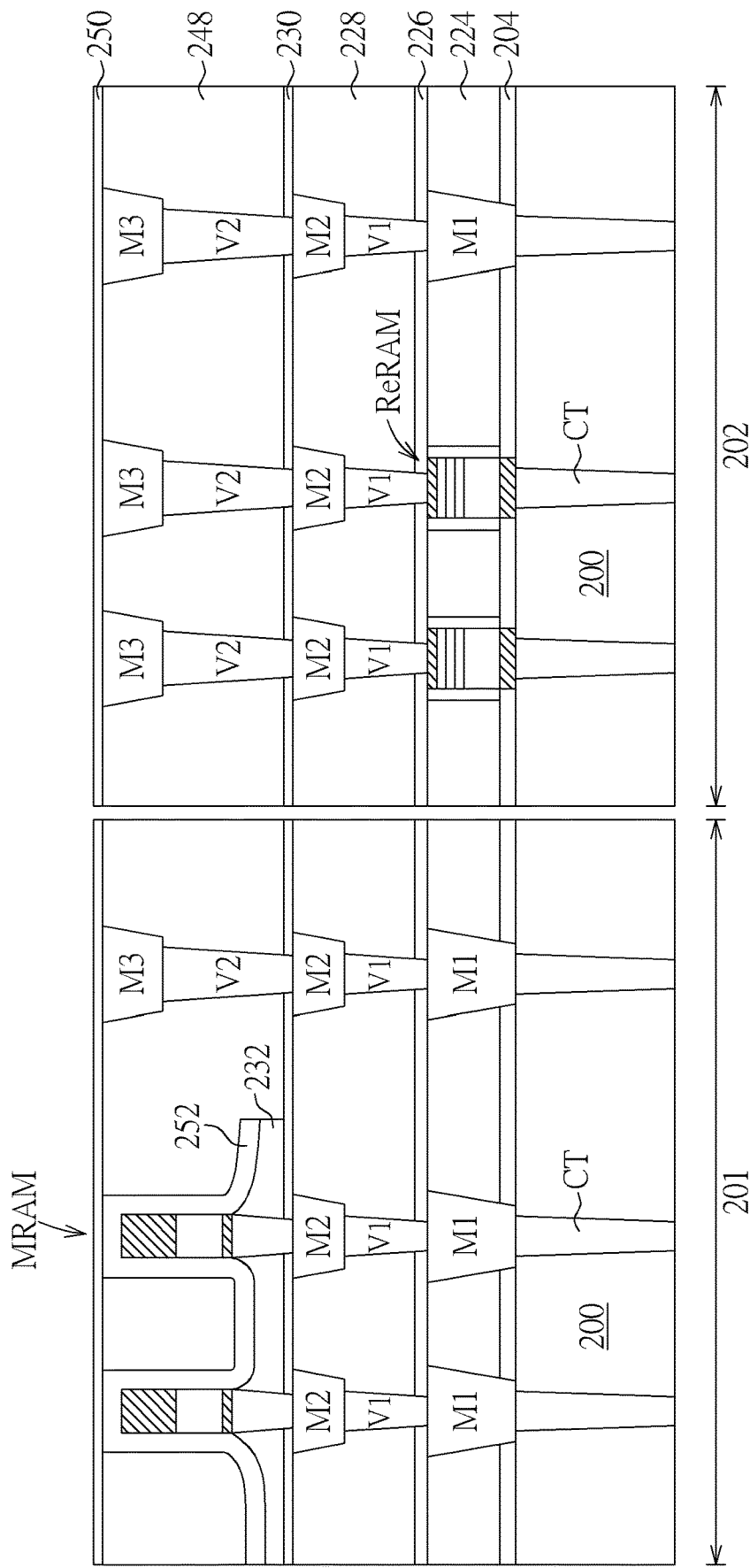

Please refer to FIG. 14. After the capping layer 252 is formed, a photolithography process is performed to remove the capping layer 252 and the dielectric layer 232 outside the MRAM region, thereby forming MRAM cells. After the MRAM cells are completed, an inter-metal dielectrics 248 surrounding the MRAM cells and interconnects such as vias V2 and third metal layer M3 inside the inter-metal dielectrics 248 are formed, and a thin dielectric capping layer 250 is formed on entire surface to cover the MRAM cells and the third metal layer M3. The material and process of the components above is the same as the ones in aforementioned embodiment. Detailed description is no more repeated.

Please note that in other embodiment, the MRAM cells may be formed in higher level rather than been limited in the level of via V2 and third metal layer M3 as shown in the figure. In addition, other BEOL processes may be followed up to form other components, such as upper interconnects, top metal layer and bonding pads, in higher level after the MRAM cells are made. Since those processes and components are not the focus of present invention, relevant description and figure are herein omitted.

In summary, the system architecture for hybrid random access memory provided in the present invention may integrate and use two different types of RAM, i.e. ReRAM and MRAM, to meet the needs of high-speed/low-speed access and digital/analog circuit. Moreover, the two different ReRAM and MRAM are manufactured on the same substrate or wafer in the same process flow, thus this system architecture is suitable for high-performance microcontroller, system-on-chip and AI application.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A system architecture for hybrid random access memory in a system-on-chip, comprising:
   a computing unit;
   a hybrid register coupled to said computing unit;
   multiple magnetoresistive random access memory (MRAM) blocks, wherein each of said MRAM blocks comprises multiple MRAM cells coupled to a MRAM controller, and said MRAM controller is coupled to said hybrid register; and
   multiple resistive random-access memory (ReRAM) blocks, wherein each of said ReRAM blocks comprises multiple ReRAM cells coupled to a ReRAM controller, and said ReRAM controller is coupled to said hybrid register;
   wherein said ReRAM cells and said MRAM cells are on the same semiconductor substrate.

2. The system architecture for hybrid random access memory in a system-on-chip according to claim 1, wherein said MRAM blocks are coupled to said ReRAM blocks.

3. The system architecture for hybrid random access memory in a system-on-chip according to claim 1, wherein each of said MRAM blocks further comprises:
   a hot spare coupled to said MRAM cells;
   a data backup unit coupled to said MRAM controller; and
   a redundant array of independent drivers (RAID) fail unit coupled to said MRAM controller.

4. The system architecture for hybrid random access memory in a system-on-chip according to claim 1, wherein each of said ReRAM blocks further comprises:
   a hot spare coupled to said ReRAM cells; and
   a RAID fail unit coupled to said ReRAM controller.

5. The system architecture for hybrid random access memory in a system-on-chip according to claim 1, wherein said hybrid register comprises a high-speed data register and a low-speed data register.

6. The system architecture for hybrid random access memory in a system-on-chip according to claim 1, wherein said computing unit comprises:
   a chip;
   a high-speed data computing controller coupled to said chip;
   a low-speed data computing controller coupled to said chip;
   a processor coupled to said chip; and
   a cache coupled to said processor.

* * * * *